United States Patent
Matsumoto et al.

(10) Patent No.: US 7,305,219 B2
(45) Date of Patent: Dec. 4, 2007

(54) PORTABLE RADIO TERMINAL AND AFC CONTROL METHOD

(75) Inventors: Mariko Matsumoto, Tokyo (JP); Shigeru Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 109 days.

(21) Appl. No.: 11/022,815

(22) Filed: Dec. 28, 2004

(65) Prior Publication Data

US 2005/0105655 A1 May 19, 2005

Related U.S. Application Data

(62) Division of application No. 10/052,777, filed on Jan. 23, 2002, now Pat. No. 7,043,216.

(51) Int. Cl.
H04B 7/00 (2006.01)
(52) U.S. Cl. ............... 455/258; 455/260; 455/182.2
(58) Field of Classification Search ................ 455/258, 455/260, 182.2, 192.2, 255
See application file for complete search history.

(56) References Cited

U.S. PATENT DOCUMENTS

| | | | | |
|---|---|---|---|---|
| 3,867,568 A | * | 2/1975 | Merriweather | 455/182.2 |
| 4,123,716 A | * | 10/1978 | Borg | 455/192.2 |
| 4,496,978 A | * | 1/1985 | Sakamoto et al. | 455/192.2 |
| 4,817,197 A | | 3/1989 | Shimizu et al. | |
| 5,060,292 A | * | 10/1991 | Ayukawa et al. | 455/505 |
| 5,416,779 A | * | 5/1995 | Barnes et al. | 455/192.2 |
| 5,515,401 A | | 5/1996 | Takenaka et al. | |
| 5,524,029 A | | 6/1996 | Takenaka et al. | |
| 5,526,383 A | | 6/1996 | Takenaka et al. | |
| 5,600,672 A | * | 2/1997 | Oshima et al. | 375/326 |
| 5,627,604 A | * | 5/1997 | Krishnamurthy et al. | 455/192.1 |
| 5,633,898 A | * | 5/1997 | Kishigami et al. | 455/182.2 |
| 5,634,205 A | * | 5/1997 | Kurisu et al. | 455/192.2 |
| 5,940,748 A | * | 8/1999 | Daughtry et al. | 455/182.2 |
| 5,987,313 A | * | 11/1999 | Lee | 455/182.2 |
| 6,233,292 B1 | * | 5/2001 | Van Bezooijen et al. | 375/344 |
| 6,275,699 B1 | | 8/2001 | Ichihara | |
| 6,693,978 B1 | * | 2/2004 | Horii et al. | 375/326 |

FOREIGN PATENT DOCUMENTS

| | | |
|---|---|---|
| EP | 0 252 444 A2 | 1/1988 |
| GB | 494734 A | 10/1938 |
| JP | 63-256010 | 10/1988 |
| JP | 63246060 A * | 10/1988 |
| JP | 05-063633 | 3/1993 |
| JP | 05-300183 | 11/1993 |
| JP | 08-032507 | 2/1996 |
| JP | 08-223063 | 8/1996 |
| JP | 09-130372 | 5/1997 |
| JP | 10-164658 | 6/1998 |
| JP | 10-210563 | 8/1998 |
| JP | 10-229491 | 8/1998 |
| JP | 10-242885 | 9/1998 |
| JP | 10-308289 | 11/1999 |
| JP | 2000-049647 | 2/2000 |
| JP | 2000-124825 | 4/2000 |

* cited by examiner

OTHER PUBLICATIONS

W.C. Lindsey et al., "A Survey of Digital Phase-Locked Loops," Proceedings of the IEEE, vol. 69:4, Apr. 1981, pp. 410-431.

Primary Examiner—Lana Le
(74) Attorney, Agent, or Firm—Foley & Lardner LLP

(57) ABSTRACT

A portable radio terminal for realizing automatic frequency control (AFC) for automatically controlling the oscillation frequency of an oscillator includes a unit for intermittently performing AFC operation, and a unit for shortening an AFC operation stop period when the frequency shift of the oscillation frequency is large. An AFC control method is also disclosed.

6 Claims, 7 Drawing Sheets

(a)

(b)

(c)

(d-1)

(d-2)

(d-3)

PORTABLE RADIO TERMINAL AND AFC CONTROL METHOD

CROSS-REFERENCE TO RELATED PATENT APPLICATIONS

This application is a division of application Ser. No. 10/052,777, filed Jan. 23, 2002, now U.S. Pat. No. 7,043,216, and related to a concurrently filed application entitled PORTABLE RADIO TERMINAL AND AFC CONTROL METHOD and based on Japanese Patent Application No. 2001-016345, filed Jan. 24, 2001, by Mariko Matsumoto and Shigeru Ono. This application claims only subject matter disclosed in the parent application and therefore presents no new matter.

BACKGROUND OF THE INVENTION

1. Field of the Invention

The present invention relates to a portable radio terminal and AFC control method which realize AFC (Automatic Frequency Control) for automatically controlling the oscillation frequency of an oscillator.

2. Description of the Prior Art

Conventional portable radio terminals applied to systems such as QPSK and WCDMA incorporate low-cost, low-precision oscillators (to be referred to as mobile station oscillators hereinafter) in order to reduce the cost of the portable radio terminal. The portable radio terminal performs AFC (Automatic Frequency Control) for detecting a frequency shift in the mobile station oscillator on the basis of a received wave sent from a higher-frequency-precision base station, feeding back the detected shift, and adjusting the frequency of the mobile station oscillator.

An example of conventional AFC control methods is disclosed in Japanese Unexamined Patent Publication No. 10-229491. In this prior art, correction data for correcting an AFC signal to be fed back to a mobile station oscillator is stored in a memory. The correction data is read out from the memory in accordance with the lapse of time so as to keep the output frequency of one mobile station oscillator constant with respect to the lapse of time after power-on operation.

In this prior art, however, large power is consumed because AFC operation continues after power-on operation. If the oscillation frequency of the oscillator greatly shifts, the signal timing shifts in an idle time, and reception may fail. High-precision frequency control is not achieved, and a malfunction may occur. Further, it is difficult to correct a frequency shift or rapidly follow phasing.

SUMMARY OF THE INVENTION

The present invention has been made in consideration of the above situations in the prior art, and has as its first object to provide a portable radio terminal and AFC control method which intermittently operate and control an AFC control system, shorten the intermittent operation period to frequently perform AFC operation for a large frequency shift, and extend the intermittent operation period and AFC operation stop period for a small frequency shift, thereby realizing high-precision AFC operation while reducing power.

It is the second object of the present invention to provide a portable radio terminal and AFC control method which change intermittent operation into the intermittent operation of the whole radio mobile station in an idle time, thereby preventing a signal timing shift and a reception failure in an idle time when the oscillation frequency of an oscillator greatly shifts.

It is the third object of the present invention to provide a portable radio terminal and AFC control method which can update a frequency shift value to the oscillator to realize high frequency precision without any malfunction when shifts in the same direction are detected N times (N: arbitrary number) because the frequency shift value includes many errors for a sufficiently small frequency shift.

It is the fourth object of the present invention to provide a portable radio terminal and AFC control method which monitor the reception quality or sync state, determine whether to input an AFC signal to the oscillator, and can avoid an AFC malfunction caused by low reliability such as a low reception quality or poor sync state.

It is the fifth object of the present invention to provide a portable radio terminal and AFC control method which monitor the reception quality, when the transmission channel state is poor, shorten the AFC intermittent operation period because the frequency may greatly shift or phasing is to be followed, and can correct a frequency shift or rapidly follow phasing.

To achieve the above objects, according to the first aspect of the present invention, there is provided a portable radio terminal for realizing automatic frequency control (AFC) for automatically controlling an oscillation frequency of an oscillator, comprising means for intermittently performing AFC operation, and means for shortening an AFC operation stop period when a frequency shift of the oscillation frequency is large.

According to the second aspect of the present invention, there is provided a portable radio terminal, further comprising means for extending the stop period in intermittent operation of the AFC operation when the frequency shift of the oscillation frequency is small.

According to the third aspect of the present invention, there is provided a radio terminal, wherein the intermittent operation includes not only the AFC operation but also operation stop of the portable radio terminal.

According to the fourth aspect of the present invention, there is provided a portable radio terminal for realizing automatic frequency control (AFC) for automatically controlling an oscillation frequency of an oscillator, comprising means for updating a frequency shift to the oscillator when the frequency shift of the oscillation frequency is smaller than a predetermined value and frequency shifts in the same direction are detected a predetermined number of times.

According to the fifth aspect of the present invention, there is provided a portable radio terminal for realizing automatic frequency control (AFC) for automatically controlling an oscillation frequency of an oscillator, comprising means for monitoring a reception quality or sync state and determining in accordance with a result whether to input a frequency shift value to the oscillator.

According to the sixth aspect of the present invention, there is provided a portable radio terminal, further comprising means for performing the AFC operation at a predetermined short period when the portable radio terminal fails in decoding, does not detect any pilot signal, or detects a step out state.

According to the seventh aspect of the present invention, there is provided an AFC control method of realizing automatic frequency control (AFC) for automatically controlling an oscillation frequency of an oscillator, comprising intermittently performing AFC operation, and when a frequency shift of the oscillation frequency is large, shortening an AFC operation stop period.

According to the eighth aspect of the present invention, there is provided an AFC control method, wherein when the frequency shift of the oscillation frequency is small, the stop period in intermittent operation of the AFC operation is extended.

According to the ninth aspect of the present invention, there is provided an AFC control method, wherein the intermittent operation includes not only the AFC operation but also operation stop of a portable radio terminal.

According to the 10th aspect of the present invention, there is provided an AFC control method of realizing automatic frequency control (AFC) for automatically controlling an oscillation frequency of an oscillator, comprising updating a frequency shift to the oscillator when the frequency shift of the oscillation frequency is smaller than a predetermined value and frequency shifts in the same direction are detected a predetermined number of times.

According to the 11th aspect of the present invention, there is provided an AFC control method of realizing automatic frequency control (AFC) for automatically controlling an oscillation frequency of an oscillator, comprising monitoring a reception quality or sync state and determining in accordance with a result whether to input a frequency shift value to the oscillator.

According to the 12th aspect of the present invention, there is provided an AFC control method, wherein the AFC operation is performed at a predetermined short period when decoding fails, no pilot signal is detected, or a step-out state is detected.

As is apparent from the above aspects, according to the present invention, an AFC control system is intermittently operated and controlled. When the frequency shift is large, the intermittent operation period is shortened, and AFC operation is frequently performed. When the frequency shift is small, the intermittent operation period and AFC operation stop period are extended. Accordingly, high-precision AFC operation can be realized while power is reduced.

According to the present invention, intermittent operation is changed into the intermittent operation of the whole radio mobile station in an idle time. When the oscillation frequency of an oscillator greatly shifts, a signal timing shift and a reception failure can be prevented in an idle time.

According to the present invention, the frequency shift value includes many errors when the frequency shift is sufficiently small. Thus, when shifts in the same direction are detected N times (N: arbitrary number), a frequency shift value to the oscillator can be updated to realize high frequency precision without any malfunction.

According to the present invention, the reception quality or sync state is monitored, and whether to input an AFC signal to the oscillator is determined. An AFC malfunction caused by low reliability such as a low reception quality or poor sync state can be avoided.

According to the present invention, the reception quality is monitored. When the transmission channel state is poor, the AFC intermittent operation period is shortened because the frequency may greatly shift or phasing is to be followed. This enables correcting a frequency shift or rapidly following phasing.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Several preferred embodiments of the present invention will be described in detail below with reference to the accompanying drawings.

Figure 1:
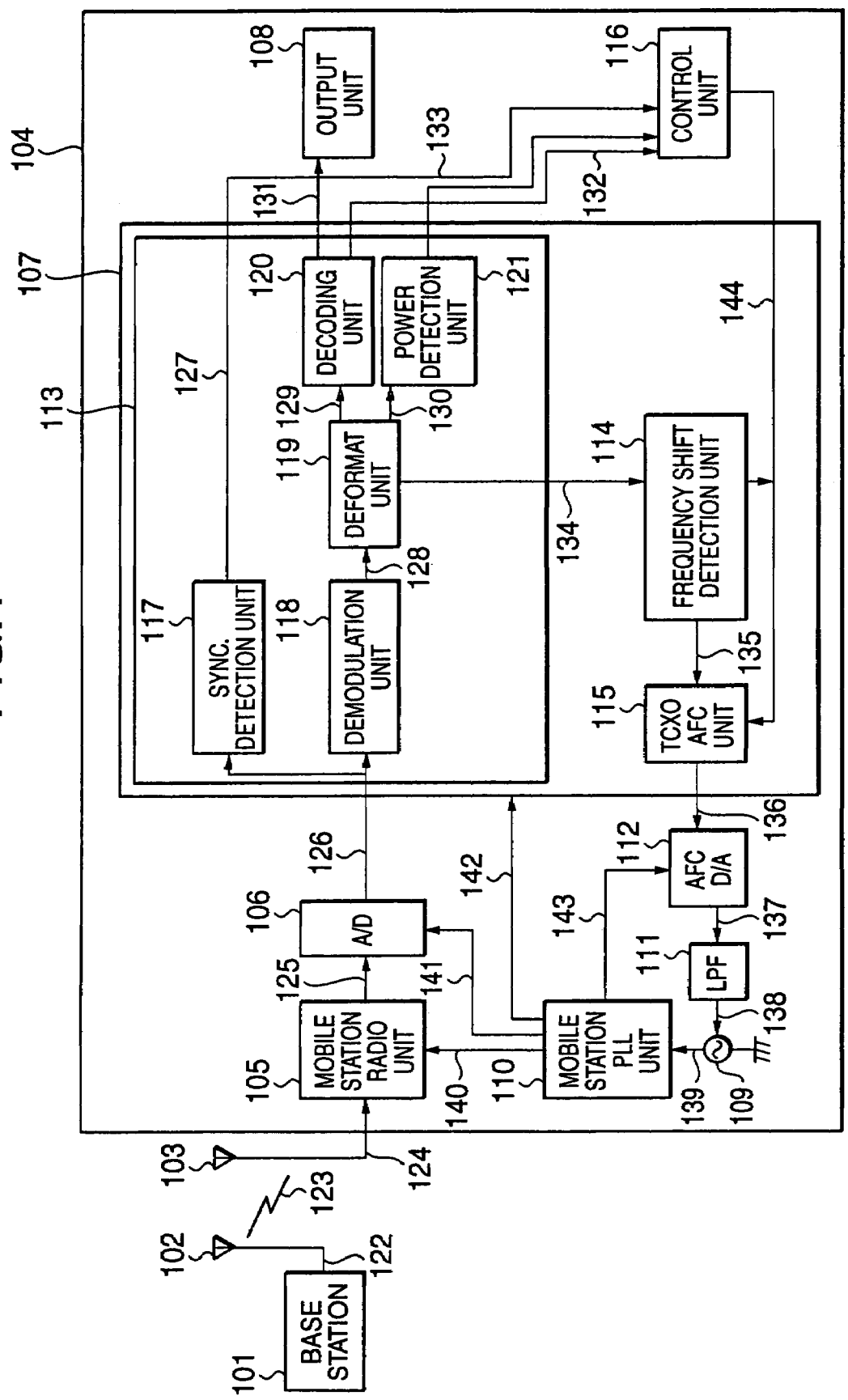
FIG. 1 is a block diagram for explaining an embodiment of an AFC control method for a portable radio apparatus according to the present invention.

FIG. 1 is a block diagram for explaining an embodiment of an AFC control method for a portable radio apparatus according to the present invention. FIG. 1 shows a base station 101 and a radio mobile station (hereinafter called mobile station) 104 applied to the embodiment. The schematic arrangement of the mobile station 104 is shown by the block diagram.

The mobile station 104 is constituted by a mobile station radio unit 105, an A/D converter 106, a signal processing unit 107 having a DSP, gate array, and standard cell, a control unit 116 having a CPU, an output unit 108 such as a loudspeaker, a mobile station oscillator 109, a mobile station PLL unit 110, an LPF (Low Pass Filter) 111, and an AFC D/A 112.

The signal processing unit 107 is made up of a mobile station data processing unit 113, frequency shift detection unit 114, TCXO AFC unit 115, and control unit 116. The mobile station data processing unit 113 is comprised of a sync detection unit 117, demodulation unit 118, deformat unit 119, decoding unit 120, and power detection unit 121.

The operation of the portable radio terminal 104 in the embodiment will be described with reference to FIG. 1. A digital signal 122 modulated in the base station 101 is transmitted from a base station antenna 102. A radio wave 123 transmitted from the base station antenna 102 is received by a portable radio terminal antenna 103, and sent as a signal 124 to the mobile station radio unit 105.

An analog signal which is obtained by down-conversion and quadrature demodulation of the channel frequency is converted into a digital signal 126 by the A/D converter 106. The digital signal 126 is input to the sync detection unit 117 of the signal processing unit 107 having a DSP, gate array, and standard cell. The sync detection unit 117 sends a sync detection signal 127 to the control unit 116 having a CPU.

The digital signal 126 sent from the A/D converter 106 is demodulated by the demodulation unit 118. A demodulated signal 128 is sent to the deformat unit 119 where the signal 128 is deformatted. Deformatted data 129 is decoded by the decoding unit 120. A decoded signal 131 is sent to the output unit 108. The decoding unit 120 outputs CRC information 132 to the control unit 116.

The deformat unit 119 transfers a power detection signal 130 to the power detection unit 121. The power detection unit 121 sends power detection information (RSSI) 133 to the control unit 116. The control unit 116 outputs a control signal 144 for controlling the frequency shift detection unit 114 and TCXO AFC unit 115 on the basis of the sync detection signal 127, CRC information 132, and RSSI 133.

The deformat unit 119 transfers to the frequency shift detection unit 114 an AFC detection signal 134 prepared by gathering pilot signals to the same frequency. The frequency shift detection unit 114 calculates a frequency shift from the AFC detection signal 134, and transfers a frequency shift value ($\Delta f$) 135 to the TCXO AFC unit 115. The frequency shift detection unit 114 intermittently operates under the control of the control unit 116.

The TCXO AFC unit 115 adds a frequency shift value and updates the TCXO AFC value ($\Delta f_{VCXO}$) under the control of the control unit 116. The TCXO AFC value is transferred as a digital AFC signal 136 to the AFC D/A 112. An AFC signal 137 D/A-converted by the AFC D/A 112 passes through the LPF 111, and is input as an AFC signal 138 to the AFC terminal of the TCXO 109. Then, the oscillation frequency of the TCXO 109 is changed.

A signal 139 oscillated from the TCXO 109 is converted by the mobile station PLL unit 110 into a plurality of signals having different frequencies. The mobile station PLL unit 110 supplies a signal 140 to the mobile station radio unit 105, a signal 141 to the A/D converter 106, a signal 142 to the signal processing unit 107, and a signal 143 to the AFC D/A 112.

In an idle time, intermittent operation is performed over a wide range in the whole mobile station 104 including the signal processing unit 107 and mobile station radio unit 105. In an idle time, the intermittent operation of the TCXO AFC unit 115 determines the intermittent operation of the overall mobile station 104.

First Embodiment

Figure 2:
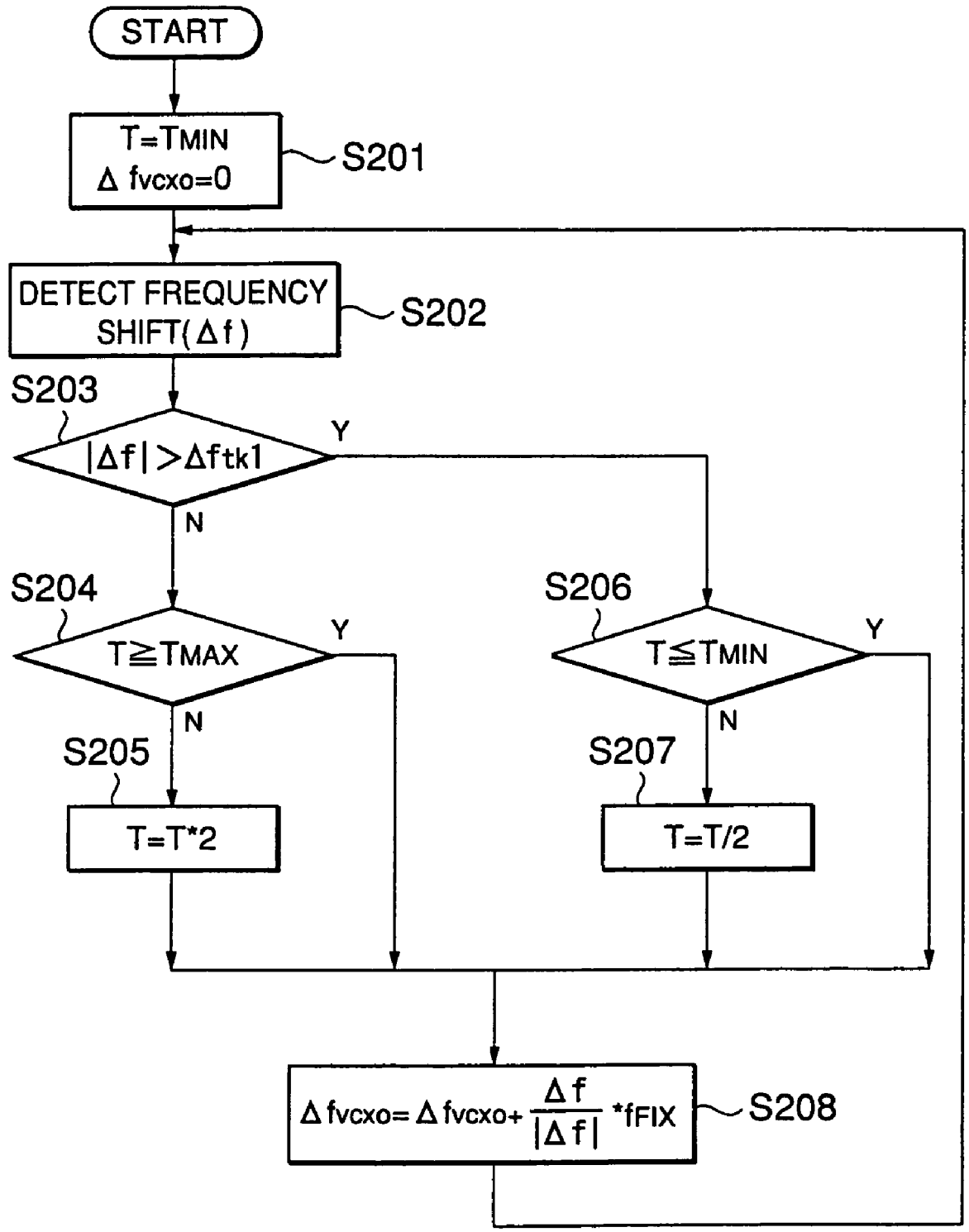
FIG. 2 is a flow chart showing an AFC control flow in the first embodiment of the present invention.

FIG. 2 is a flow chart showing an AFC control flow in the first embodiment of the present invention. AFC control operation generally starts when a portable radio terminal is powered on. The oscillation frequency of a mobile station oscillator 109 shifts due to degradation in temperature characteristic over time or the like.

A control unit 116 sets a minimum value $T_{MIN}$ as an intermittent operation period T in a frequency shift detection unit 114 in advance, and sets 0 as a TCXO AFC value ($\Delta f_{VCXO}$) in a TCXO AFC unit 115 (step S201). If the frequency shift detection unit 114 detects $\Delta f$ from an AFC detection signal 134 (step S202), the control unit 116 checks whether the detected $\Delta f$ is larger than a predetermined value $\Delta f_{tk1}$ (positive value) (step S203).

If the control unit 116 determines that $\Delta f$ is $\Delta f_{tk1}$ or less (NO in step S203), it checks whether the intermittent operation period T (minimum value $T_{MIN}$ at this time) set in the frequency shift detection unit 114 is larger than a predetermined maximum value $T_{MAX}$ or more (step S204). Since the intermittent operation period set in the frequency shift detection unit 114 is the minimum value $T_{MIN}$, the control unit 116 determines that the intermittent operation period T is smaller than $T_{MAX}$ (NO in step S204), and sets an intermittent operation period twice the intermittent operation period $T_{MIN}$ in the frequency shift detection unit 114 (step S205).

If $\Delta f$ detected by the frequency shift detection unit 114 is a positive value, the control unit 116 adds a predetermined value $\Delta f_{FIX}$ (positive value) to $\Delta f_{VCXO}$ (0 at this time) to update the TCXO AFC value; or if $\Delta f$ detected by the frequency shift detection unit 114 is a negative value, the control unit 116 adds a predetermined value $-\Delta f_{FIX}$ to $\Delta f_{VCXO}$ (0 at this time) to update the TCXO AFC value (step S208).

If the control unit 116 determines in step S204 that the intermittent operation period T set in the frequency shift detection unit 114 is $T_{MAX}$ or more (YES in step S204), it does not change the intermittent operation period T. After that, if $\Delta f$ detected by the frequency shift detection unit 114 is a positive value, the control unit 116 adds the predetermined value $\Delta f_{FIX}$ (positive value) to $\Delta f_{VCXO}$ to update the TCXO AFC value; or if $\Delta f$ detected by the frequency shift detection unit 114 is a negative value, the control unit 116 adds the predetermined value $-\Delta f_{FIX}$ to $\Delta f_{VCXO}$ to update the TCXO AFC value (step S208).

If the control unit 116 determines in step S203 that $\Delta f$ is larger than $\Delta f_{tk1}$ (YES in step S203), it checks whether the intermittent operation period T is the minimum value $T_{MIN}$ or less (step S206). If the control unit 116 determines that the intermittent operation period T is larger than $T_{MIN}$ (NO in step S206), it sets an intermittent operation period ½ the current intermittent operation period in the frequency shift detection unit 114 (step S207).

If $\Delta f$ detected by the frequency shift detection unit 114 is a positive value, the control unit 116 adds the predetermined value $\Delta f_{FIX}$ (positive value) to $\Delta f_{VCXO}$ to update the TCXO AFC value; or if $\Delta f$ detected by the frequency shift detection unit 114 is a negative value, the control unit 116 adds the predetermined value $-\Delta f_{FIX}$ to $\Delta f_{VCXO}$ to update the TCXO AFC value (step S208).

If the control unit 116 determines in step S206 that the intermittent operation period T is $T_{MIN}$ or less (YES in step S206), it does not change the current intermittent operation period T. Then, if $\Delta f$ detected by the frequency shift detection unit 114 is a positive value, the control unit 116 adds the predetermined value $\Delta f_{FIX}$ (positive value) to the TCXO AFC value ($\Delta f_{VCXO}$) of the TCXO AFC unit 115; or if $\Delta f$ detected by the frequency shift detection unit 114 is a negative value, the control unit 116 adds the predetermined value $-\Delta f_{FIX}$ to the TCXO AFC value ($\Delta f_{VCXO}$) of the TCXO AFC unit 115 (step S208).

Figure 3:
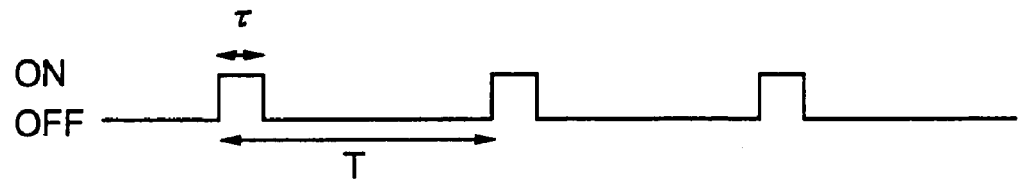
FIG. 3 is a timing chart for explaining intermittent operation and a related operation in the present invention.
Figure 3:
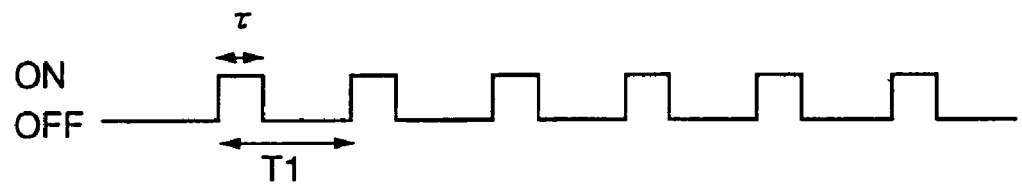
Figure 3:
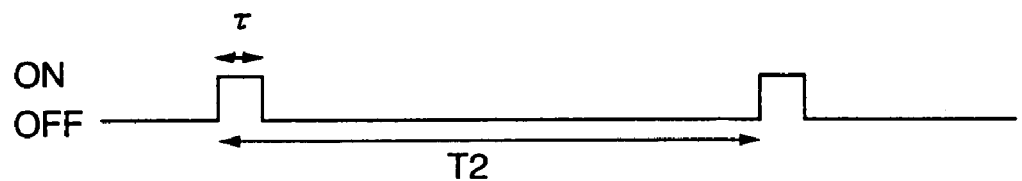
Figure 3:
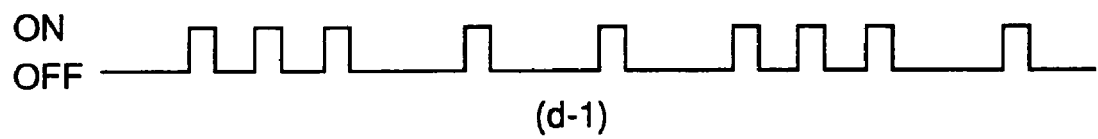
Figure 3:
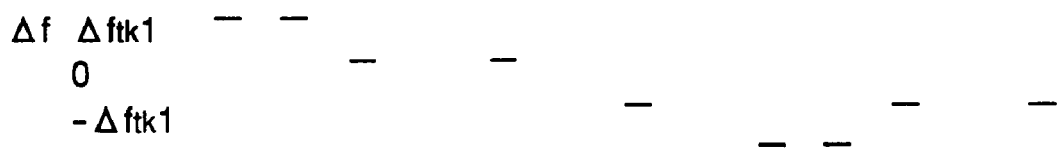
Figure 3:
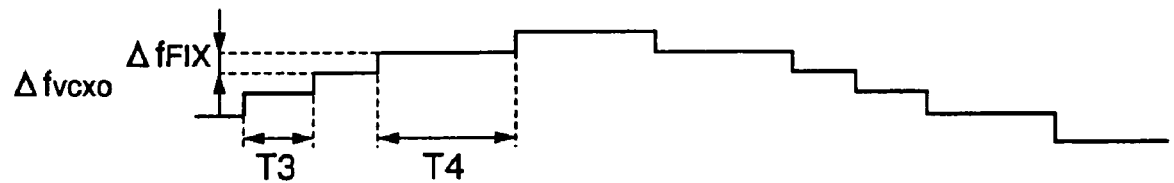

(a) in FIG. 3 shows a control signal output from the control unit 116 to the frequency shift detection unit 114, a period $\tau$ during which the frequency shift detection unit 114 is ON, and the intermittent operation period T of the frequency shift detection unit 114. (b) shows the state of the control signal when the intermittent operation period T is set ½ in step S207 of FIG. 2. (c) shows the state of the control signal when the intermittent operation period T is set twice in step S205 of FIG. 2.

(d-1) to (d-3) show an example of a control signal output from the control unit 116 in the operation in the flow chart of FIG. 2. (d-1) shows that the frequency shift detection unit 114 is operated while the intermittent operation period T is changed. (d-2) shows $\Delta f$ detected by the frequency shift detection unit 114 at that time. (d-3) shows the value $\Delta f_{VCXO}$ output from the TCXO AFC unit 115. At this time, $T_{MIN}$ is ½$T_{MAX}$.

Second Embodiment

Figure 4:
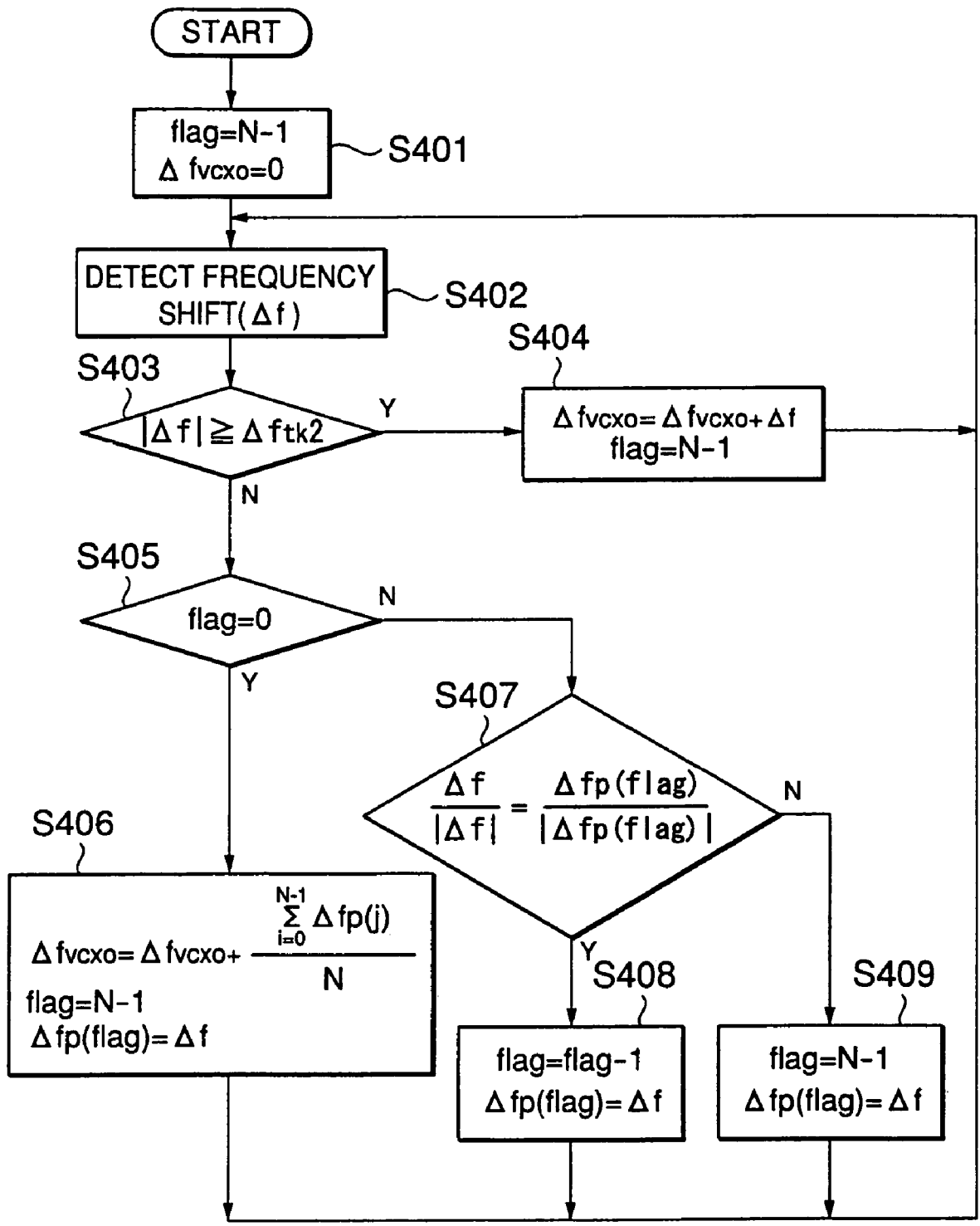
FIGS. 4 to 7 are flow charts showing the AFC control flow of a portable radio terminal in each of the second to fifth embodiments of the present invention.

FIG. 4 is a flow chart showing an AFC control flow in the second embodiment of the present invention. AFC control operation generally starts when a portable radio terminal is powered on. The oscillation frequency of a mobile station oscillator 109 shifts due to degradation in temperature characteristic over time or the like.

A control unit 116 sets N−1 (N: predetermined repeat number) in flag, and sets 0 as a TCXO AFC value ($\Delta f_{VCXO}$) in a TCXO AFC unit 115 (step S401). If a frequency shift detection unit 114 detects $\Delta f$ (step S402), the control unit 116 checks whether the detected Δf is a predetermined value Δf$_{tk2}$ (positive value) or more (step S403).

If the control unit 116 determines that Δf is Δf$_{tk2}$ or more (YES in step S403), it registers in the TCXO AFC unit 115 a new TCXO AFC value obtained by adding Δf to Δf$_{VCXO}$, and registers N−1 in flag again (step S404).

If the control unit 116 determines that Δf is smaller than Δf$_{tk2}$ (NO in step S403), it checks whether flag is 0 (step S405). Since flag is N−1, the control unit 116 determines that flag is not 0 (NO in step S405), and checks whether the currently detected Δf and the previously detected Δf, i.e., Δfp (flag) have the same sign (step S407).

If the control unit 116 determines in step S407 that the currently detected Δf and the previously detected Δf have the same sign (YES in step S407), it decrements flag by 1, and registers the currently detected Δf as Δfp (flag) (step S408).

If the control unit 116 determines in step S407 that the currently detected Δf and the previously detected Δf do not have the same sign (NO in step S407), it registers N−1 in flag, and registers the currently detected Δf as Δfp (flag) (step S409).

If the control unit 116 determines in step S405 that flag is 0 (YES in step S405), it registers as the TCXO AFC value a value obtained by adding to Δf$_{VCXO}$ the average of Δf detected N times by the frequency shift detection unit 114, registers N−1 in flag, and registers the currently detected Δf as Δfp (flag) (step S406).

In the second embodiment, if the detected frequency shift Δf is smaller than the predetermined value Δf$_{tk2}$, the value Δf is reflected on Δf$_{VCXO}$ only when frequency shifts Δf of the same sign are successively detected N times. Although noise attains a larger influence for a smaller frequency shift, a malfunction by inputting an erroneous value Δf to the TCXO AFC unit 115 can be avoided.

Third Embodiment

Figure 5:
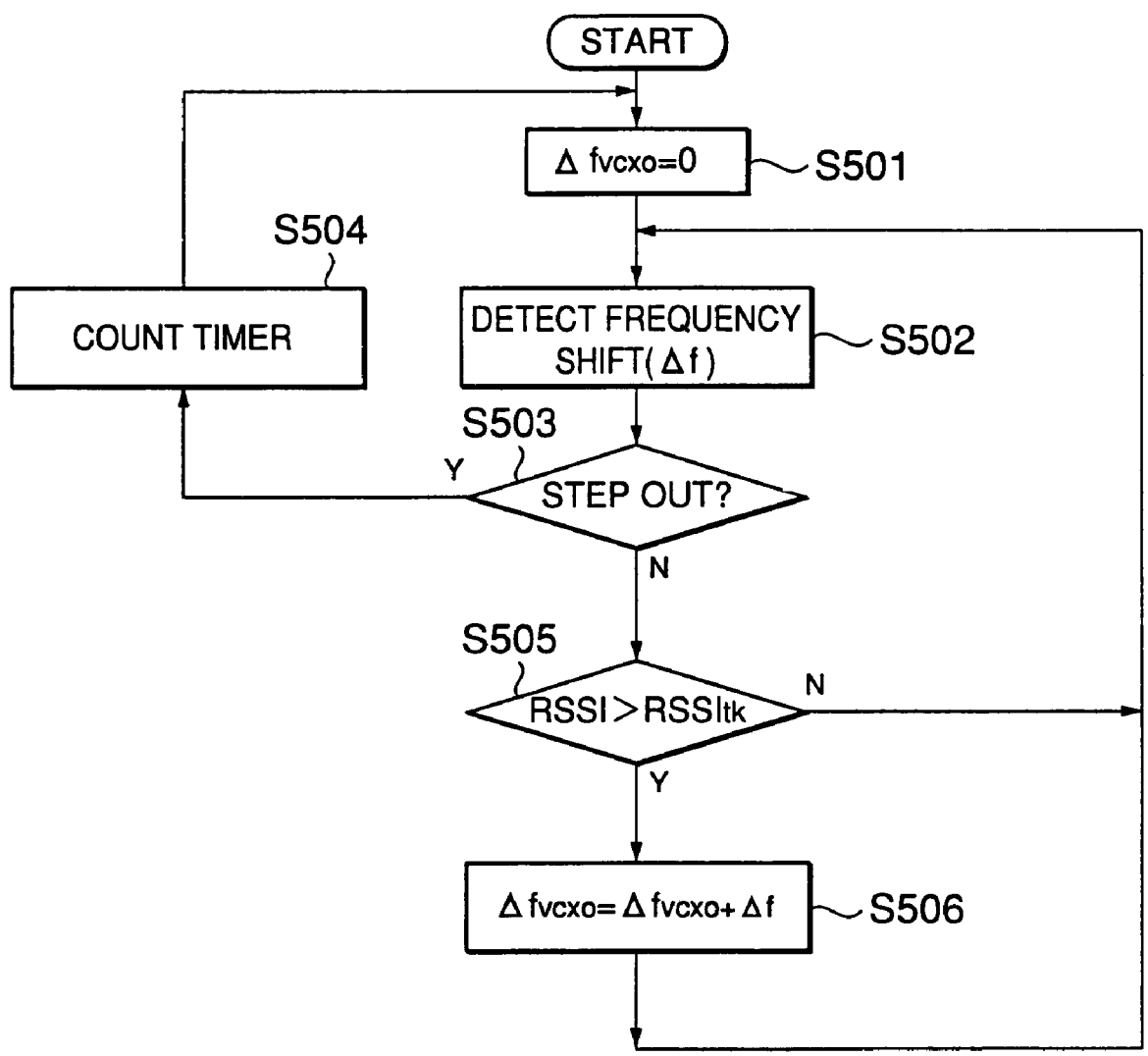

FIG. 5 is a flow chart showing an AFC control flow in the third embodiment of the present invention. AFC control operation generally starts when a portable radio terminal is powered on. The oscillation frequency of a mobile station oscillator 109 shifts due to degradation in temperature characteristic over time or the like.

A control unit 116 sets 0 as a TCXO AFC value (Δf$_{VCXO}$) in a TCXO AFC unit 115 (step S501). If a frequency shift detection unit 114 detects Δf (step S502), the control unit 116 checks on the basis of sync information from a sync detection unit 117 whether the communication state has stepped out (step S503). If the control unit 116 determines that the communication state has stepped out when the frequency shift detection unit 114 detects Δf (YES in step S503), the control unit 116 counts a timer for a predetermined period to establish synchronization (step S504), and executes processing from step S501.

If the control unit 116 determines in step S503 that the communication state is in sync (NO in step S503), it checks whether RSSI output from a power detection unit 121 is larger than a predetermined value RSSI$_{tk}$ (step S505). If the control unit 116 determines that RSSI is larger than RSSI$_{tk}$ (YES in step S505), it registers the sum of Δf$_{VCXO}$ and Δf as the TCXO AFC value in the TCXO AFC unit 115 (step S506). If the control unit 116 determines in step S505 that RSSI is RSSI$_{tk}$ or less (NO in step S505), it determines that the obtained value Δf is low in reliability because of a small power of a received signal, and does not update Δf$_{VCXO}$.

Fourth Embodiment

Figure 6:
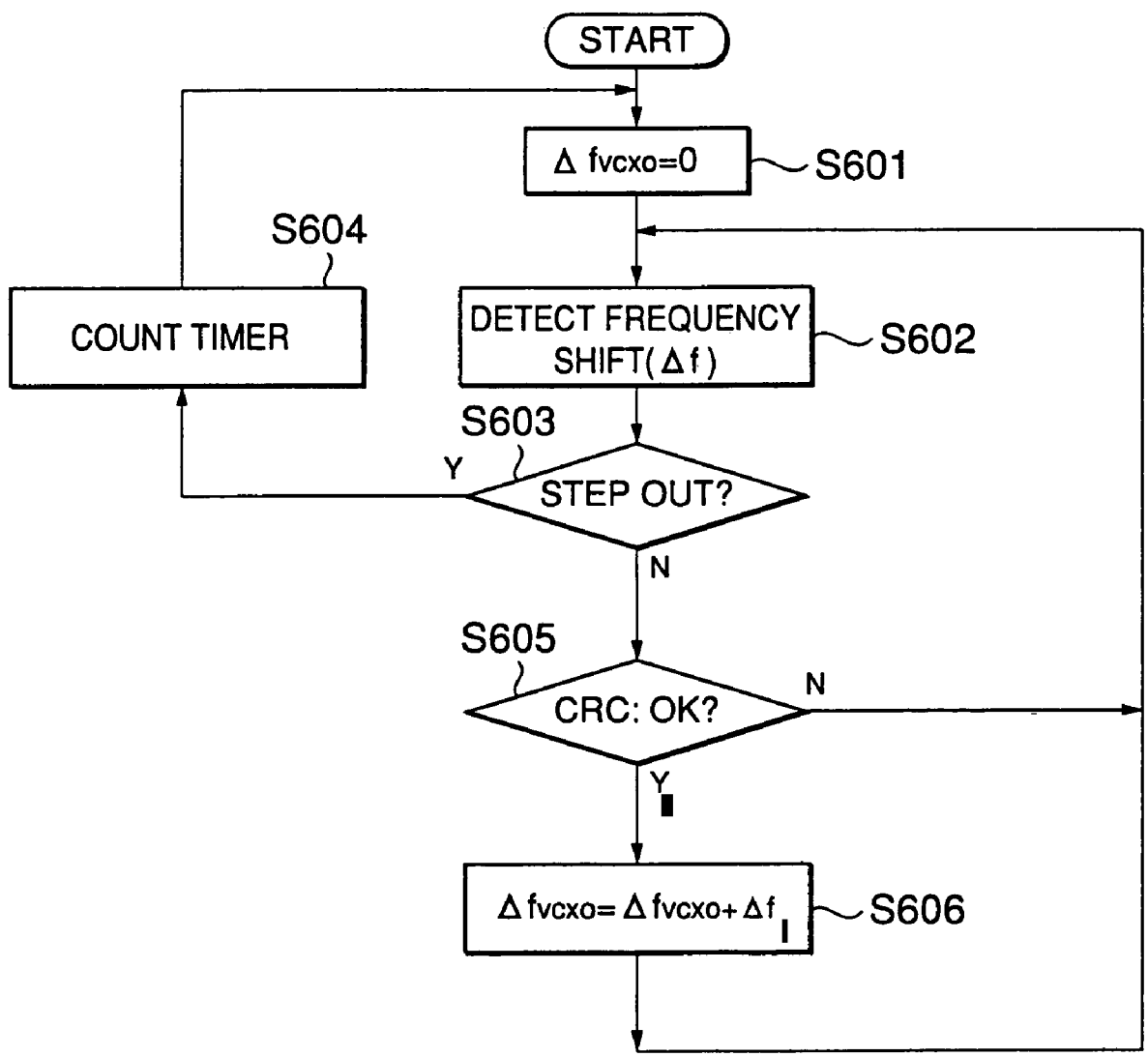

FIG. 6 is a flow chart showing an AFC control flow in the fourth embodiment of the present invention. AFC control operation generally starts when a portable radio terminal is powered on. The oscillation frequency of a mobile station oscillator 109 shifts due to degradation in temperature characteristic over time or the like.

A control unit 116 sets 0 as a TCXO AFC value (Δf$_{VCXO}$) in a TCXO AFC unit 115 (step S601). If a frequency shift detection unit 114 detects Δf (step S602), the control unit 116 checks on the basis of sync information from a sync detection unit 117 whether the communication state has stepped out (step S603). If the control unit 116 determines that the communication state has stepped out when the frequency shift detection unit 114 detects Δf (YES in step S603), the control unit 116 counts a timer for a predetermined period to establish synchronization (step S604), and executes processing from step S601.

If the control unit 116 determines in step S603 that the communication state is in sync (NO in step S603), and determines from CRC (Cyclic Redundancy Check) information obtained by a decoding unit 120 that the transmission frame does not contain any error (YES in step S605), the control unit 116 registers the sum of Δf$_{VCXO}$ and Δf as the TCXO AFC value in the TCXO AFC unit 115 (step S606). If the control unit 116 determines from CRC information that the transmission frame contains an error (NO in step S605), it determines that the obtained value Δf is low in reliability because of a poor transmission channel state between a base station 101 and a portable radio apparatus, and does not update Δf$_{VCXO}$.

Fifth Embodiment

Figure 7:
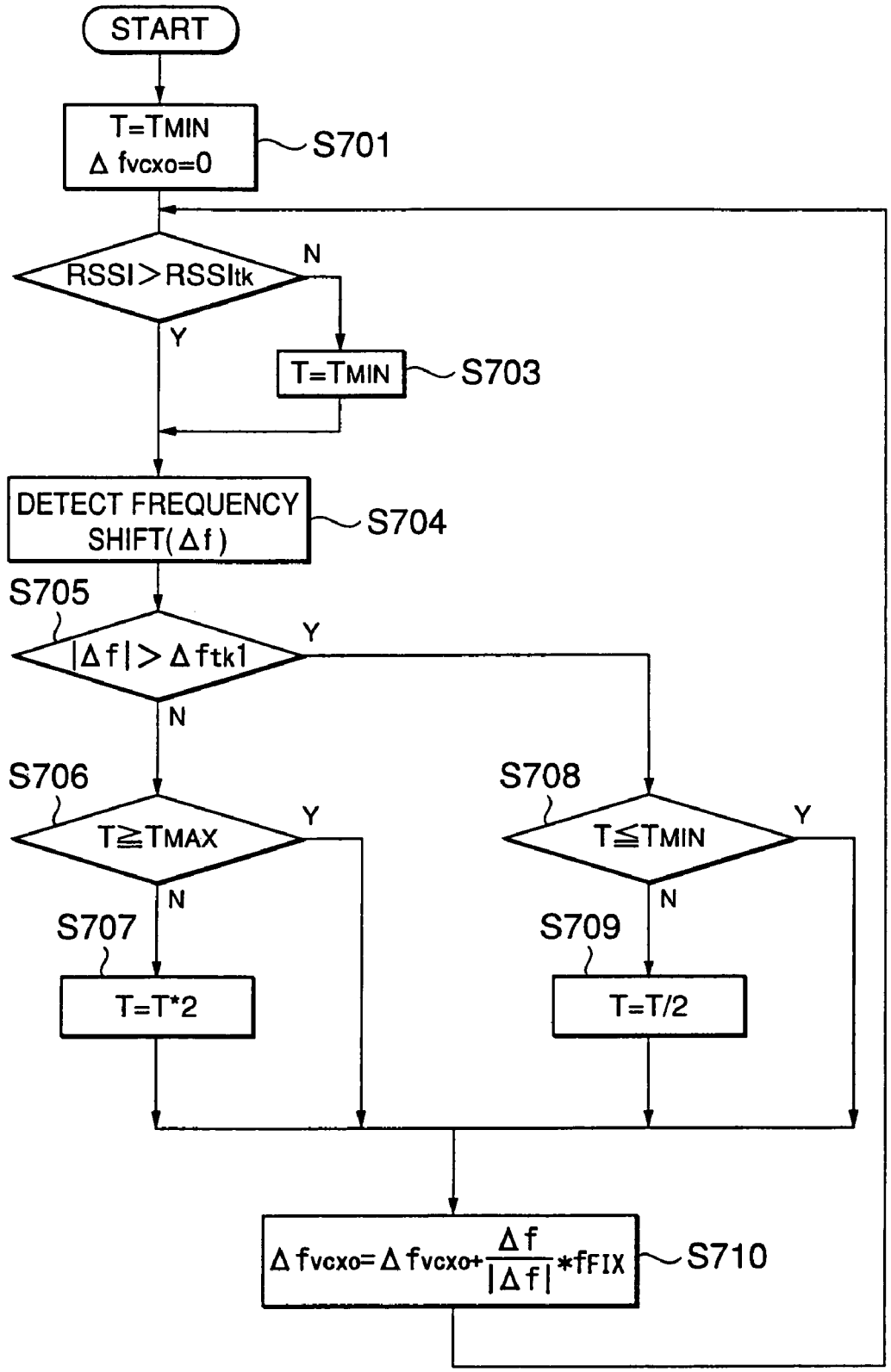

FIG. 7 is a flow chart showing an AFC control flow in the fifth embodiment of the present invention. AFC control operation generally starts when a portable radio terminal is powered on. The oscillation frequency of a mobile station oscillator 109 shifts due to degradation in temperature characteristic over time or the like.

A control unit 116 sets a minimum value T$_{MIN}$ as an intermittent operation period T in a frequency shift detection unit 114 in advance, and sets 0 as a TCXO AFC value in frequency shift detection unit 114 (step S701). The control unit 116 checks whether RSSI output from a power detection unit 121 is larger than a predetermined value RSSI$_{tk2}$ (step S702).

If the control unit 116 determines in step S702 that RSSI is RSSI$_{tk2}$ or less (NO in step S702), it determines that the oscillation frequency of the TCXO 109 may have greatly shifted, sets the minimum value T$_{MIN}$ as an intermittent operation period (step S703), and performs AFC at a short period. If the frequency shift detection unit 114 detects Δf (step S704), the control unit 116 checks whether the detected value Δf is larger than a predetermined value Δf$_{tk1}$ (positive value) (step S705).

If the control unit 116 determines that Δf is Δf$_{tk1}$ or less (NO in step S705), it checks whether the intermittent operation period T (minimum value T$_{MIN}$ at this time) set in the frequency shift detection unit 114 is a predetermined maximum value T$_{MAX}$ or more (step S706). Since the intermittent operation period set in the frequency shift detection unit 114 is the minimum value T$_{MIN}$, the control unit 116 determines that the intermittent operation period T is smaller than T$_{MAX}$ (NO in step S706), and sets an intermittent operation period twice the intermittent operation period $T_{MIN}$ in the frequency shift detection unit 114 (step S707).

If $\Delta f$ detected by the frequency shift detection unit 114 is a positive value, the control unit 116 adds a predetermined value $\Delta f_{FIX}$ (positive value) to $\Delta f_{VCXO}$ (0 at this time) to update the TCXO AFC value; or if $\Delta f$ detected by the frequency shift detection unit 114 is a negative value, the control unit 116 adds a predetermined value $-\Delta f_{FIX}$ to $\Delta f_{VCXO}$ (0 at this time) to update the TCXO AFC value (step S710).

If the control unit 116 determines in step S706 that the intermittent operation period T set in the frequency shift detection unit 114 is $T_{MAX}$ or more (YES in step S706), it does not change the intermittent operation period T. Then, if $\Delta f$ detected by the frequency shift detection unit 114 is a positive value, the control unit 116 adds the predetermined value $\Delta f_{FIX}$ (positive value) to $\Delta f_{VCXO}$ to update the TCXO AFC value; or if $\Delta f$ detected by the frequency shift detection unit 114 is a negative value, the control unit 116 adds the predetermined value $-\Delta f_{FIX}$ to $\Delta f_{VCXO}$ to update the TCXO AFC value (step S710).

If the control unit 116 determines in step S705 that $\Delta f$ is larger than $\Delta f_{th1}$ (YES in step S705), it checks whether the intermittent operation period T is the minimum value $T_{MIN}$ or less (step S708). If the control unit 116 determines that the intermittent operation period T is larger than $T_{MIN}$ (NO in step S708), it sets an intermittent operation period ½ the current intermittent operation period in the frequency shift detection unit 114 (step S709).

If $\Delta f$ detected by the frequency shift detection unit 114 is a positive value, the control unit 116 adds the predetermined value $\Delta f_{FIX}$ (positive value) to $\Delta f_{VCXO}$ to update the TCXO AFC value; or if $\Delta f$ detected by the frequency shift detection unit 114 is a negative value, the control unit 116 adds the predetermined value $-\Delta f_{FIX}$ to $\Delta f_{VCXO}$ to update the TCXO AFC value (step S710).

If the control unit 116 determines in step S708 that the intermittent operation period T is $T_{MIN}$ or less (YES in step S708), it does not change the current intermittent operation period T. Then, if $\Delta f$ detected by the frequency shift detection unit 114 is a positive value, the control unit 116 adds the predetermined value $\Delta f_{FIX}$ (positive value) to the TCXO AFC value ($\Delta f_{VCXO}$) of the TCXO AFC unit 115; or if $\Delta f$ detected by the frequency shift detection unit 114 is a negative value, the control unit 116 adds the predetermined value $-\Delta f_{FIX}$ to the TCXO AFC value ($\Delta f_{VCXO}$) of the TCXO AFC unit 115 (step S710).

What is claimed is:

1. A portable radio terminal for realizing automatic frequency control (AFC) for automatically controlling an oscillation frequency of an oscillator, comprising:
   means for detecting whether a frequency shift value in a received signal is greater than a frequency shift threshold;
   means for setting, if the frequency shift value in the received signal is greater than or equal to the frequency shift threshold and a current AFC intermittent operation performing period is greater than a minimum threshold period, an AFC intermittent operation performing period to a first value less than the current AFC intermittent operation performing period; and
   means for setting, if the frequency shift value in the received signal is less than the frequency shift threshold and the current AFC intermittent operation performing period is greater than a maximum threshold period, an AFC intermittent operation performing period to a second value greater than the current AFC intermittent operation performing period,
   wherein the maximum threshold period is greater than the minimum threshold period.

2. The portable radio terminal according to claim 1, wherein, if the frequency shift value in the received signal as detected by the detecting means is less than the frequency shift threshold and the current AFC intermittent operation performing period is greater than the maximum threshold period, an AFC intermittent operation performing period for a next period is maintained by the setting means at a value corresponding to the current AFC intermittent operation performing period.

3. The portable radio terminal according to claim 1, wherein, if the frequency shift value in the received signal as detected by the detecting means is greater than the frequency shift threshold and the current AFC intermittent operation performing period is less than the minimum threshold period, an AFC intermittent operation performing period for a next period is maintained by the setting means at a value corresponding to the current AFC intermittent operation performing period.

4. The portable radio terminal according to claim 1, wherein the first value corresponds to one-half the current AFC intermittent operation performing period, and wherein the second value corresponds to twice the current AFC intermittent operation performing period.

5. A portable radio terminal for realizing automatic frequency control (AFC) for automatically controlling an oscillation frequency of an oscillator, comprising:
   means for intermittently performing AFC operation;
   means for detecting a frequency shift in a received signal;
   means for detecting whether an out-of-sync state currently exists for the portable radio terminal;
   means for determining whether the received signal can be correctly decoded; and
   means for performing an AFC operation at a next intermittent time period based on the detected frequency shift only when both: a) the out-of-sync state is detected to currently exist for the portable radio terminal, and b) the received signal is determined to be correctly decoded,
   wherein the AFC operation is not performed at the next intermittent time period when the out-of-sync state is not detected to currently exist for the portable radio terminal or when the received signal is not determined to be correctly decoded.

6. The portable radio terminal according to claim 5, further comprising a timer,
   wherein, when the detecting means detects that an out-of-sync state does not currently exist for the portable radio terminal, the timer is started and when the timer reaches a predetermined count, the detecting means is enabled again to detect if an out-of-sync state currently exists for the portable radio terminal,
   wherein no AFC operation is performed while the timer is counting up to the predetermined count.

* * * * *